Figure 1:
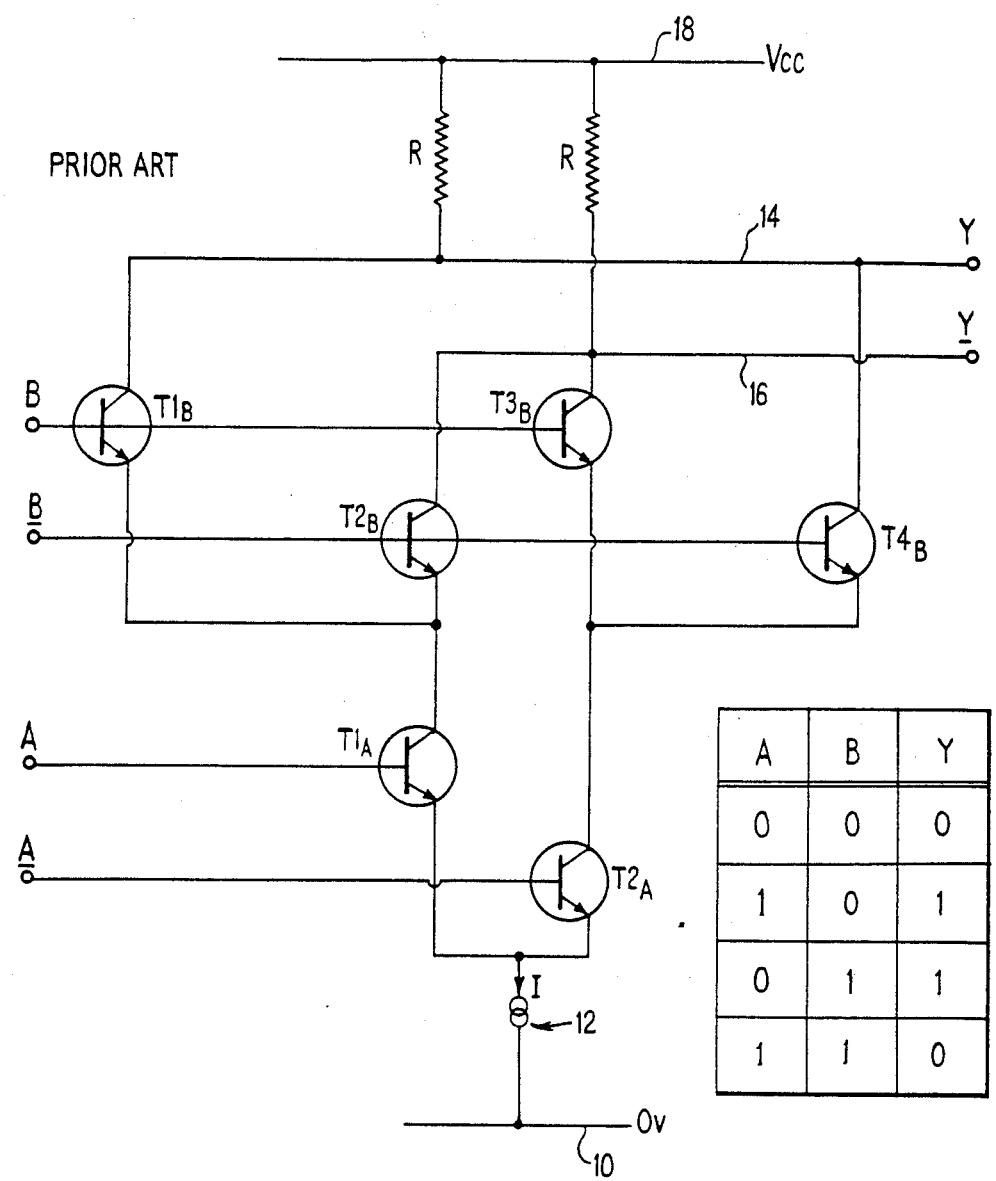

United States Patent [19]

Mallinson

[11] Patent Number: 4,633,104
[45] Date of Patent: Dec. 30, 1986

[54] BIPOLAR TRANSISTOR LOGIC CIRCUITS

[75] Inventor: Andrew M. Mallinson, Salem, N.H.

[73] Assignee: Ferranti plc, Cheshire, England

[21] Appl. No.: 650,649

[22] Filed: Sep. 14, 1984

[30] Foreign Application Priority Data

Sep. 15, 1983 [GB] United Kingdom ............... 8324710

[51] Int. Cl.[4] ............... H03K 19/082; H03K 19/086; H03K 19/20; H03K 19/21
[52] U.S. Cl. .................. 307/454; 307/455; 307/467; 307/471; 307/480
[58] Field of Search ............... 307/454–455, 307/466, 467, 471, 472, 243; 364/784, 786

[56] References Cited

U.S. PATENT DOCUMENTS

| | | |
|---|---|---|
| 3,446,989 | 5/1969 | Allen et al. |
| 3,519,810 | 7/1970 | Priel et al. ............... 307/455 X |
| 4,215,418 | 7/1980 | Muramatsu ............... 307/455 X |
| 4,276,485 | 6/1981 | Rydval ............... 307/455 X |
| 4,408,134 | 10/1983 | Allen ............... 307/455 X |
| 4,513,283 | 4/1985 | Leininger ............... 307/467 X |
| 4,560,888 | 12/1985 | Oida ............... 307/455 X |

FOREIGN PATENT DOCUMENTS

| | | |
|---|---|---|
| 30219 | 3/1980 | Japan ............... 307/455 |
| 1206008 | 9/1970 | United Kingdom . |
| 1279512 | 6/1972 | United Kingdom . |
| 1316319 | 5/1973 | United Kingdom . |
| 1501311 | 2/1978 | United Kingdom . |
| 2046544 | 11/1980 | United Kingdom . |
| 2144286 | 2/1985 | United Kingdom . |

OTHER PUBLICATIONS

Davis et al, "Sixteen-Input Funnel Utilizing Five–Level Differential Cascode Current Switch", *IBM TDB;* vol. 26, No. 7A, pp. 3515–3517; 12/1983.
Wernicke, "Circuit Concept for Rapidly Reading and Writing Semiconductor Storages with Diode-Coupled Cells"; *IBM TDB*, vol. 25, No. 6, pp. 2746–2750; 11/1982.

*Primary Examiner*—Larry N. Anagnos
*Attorney, Agent, or Firm*—Kerkam, Stowell, Kondracki & Clarke

[57] ABSTRACT

A bipolar transistor logic circuit has a hierarchical arrangement of pairs of bipolar transistors, each pair of transistors having their emitters connected together, and the bases of at least some pairs receiving a differential input to the logic circuit. The highest level has only one pair of transistors, with their emitters connected to a constant current source. A differential output is provided on two lines, at least the collectors of the lowest level being coupled selectively to the lines. The arrangement is required to be symmetrical. In an otherwise non-symmetrical arrangement, the arrangement is made symmetrical by including dummy pairs of transistors not receiving a differential input. In performing a logical operation, the differential output, and the collector potentials of each pair of transistors start to vary in the appropriate sense. Further, there is a switch controlling the constant current source enabling the logic circuit to be driven ON and OFF so that the logic circuit starts each operation in the equilibrium condition. Hence the logic circuit is fast in operation. In one embodiment, the logic circuit also includes a latch having two parallel arms, each arm including an input transistor coupled to the hierarchical arrangement, and a switching transistor. The switching transistor collectors and bases are cross-coupled, and the emitters are connected together and to two parallel constant current sources. The output of one source is insufficient to drive the latch, but is sufficient to set the latch. The output of the other source is sufficient to drive the latch, and is connected to the switching transistors via controlled by timing means common also to the switch associated with the hierarchical arrangement.

8 Claims, 8 Drawing Figures

BIPOLAR TRANSISTOR LOGIC CIRCUITS

This invention relates to bipolar transistor logic circuits, and in particular, to such logic circuits each comprising at least three gating combinations of bipolar switching transistors, in the form of a symmetrical hierarchical arrangement with a plurality of constituent levels, the highest level having only one gating combination, each gating combination comprising an associated pair of switching transistors, for each associated pair of switching transistors, considered individually, the emitters being connected together, and for the gating combination of the highest level of the hierarchical arrangement, the emitters being connected to a constant current source capable of driving a pair of transistors, and for each gating combination of each other constituent level of the hierarchical arrangement, except the highest level, the emitters being connected to a collector of an associated pair of switching transistors of the adjacent higher level of the hierarchical arrangement, the two collectors of the associated pair of switching transistors of the highest level of the hierarchical arrangement, and at least one collector of each associated pair of switching transistors of each other level of the hierarchical arrangement, except the lowest level, being connected individually to the emitters of an associated pair of switching transistors of the adjacent lower level of the hierarchical arrangement, the arrangement being such that differential inputs to the logic circuit are received by the transistor bases, and the arrangement being such that a differential input is to be supplied individually to each of the constituent levels of the hierarchical arrangement, and different differential inputs are supplied to different constituent levels of the hierarchical arrangement, in response to the differential inputs a corresponding differential output being provided on two lines of the logic circuit, the two lines being at least coupled, selectively, to the collectors of associated pairs of switching transistors of at least the lowest level of the hierarchical arrangement, all the collectors of the associated pairs of input transistors of the lowest level of the hierarchial arrangement being coupled selectively to one or other of the two output lines, and the desired logic function for the logic circuit is obtained by current flowing through the gating combinations being switched ON and OFF, at the constituent switching transistors, in response to the input signal potentials varying between two possible input logic levels associated with each gating combination, causing the corresponding output signal potentials from the logic circuit to vary between two possible output logic levels.

It is assumed in this specification, and the accompanying claims, that the bipolar switching transistors of each logic circuit to which the present invention relate are NPN transistors. It will be understood that the bipolar switching transistors could comprise PNP transistors, with corresponding modifications to the logic circuits described and claimed herein.

When the two collectors of the associated pair of input switching transistors of the highest level of a hierarchical arrangement, and at least one collector of each associated pair of switching transistors of each other level of the hierarchical arrangement, other than the lowest level, are connected individually to the emitters of an associated pair of input switching transistors of the adjacent lower level of the hierarchical arrangement, the hierarchical arrangement is considered to be symmetrical in form, and, for example, the logic circuit comprises an Exclusive OR gate in accordance with the negative logic convention.

Series of discrete input voltage signals are considered as being provided to the bases of switching transistors, when the logic circuit is operating, and each such series is referred to herein as an input to the logic circuit. The inputs are operated upon within the logic circuit, and, in response, corresponding output voltage signals are provided, there being provided series of discrete output voltage signals in response to the series of discrete input voltage signals, each series of discrete output voltage signals being referred to herein as an output from the logic circuit.

A bipolar transistor logic circuit to which the present invention relates is arranged to receive simultaneously at least two associated pairs of input voltage signals, and, in response, to provide an associated pair of output voltage signals, for each associated pair of signals, considered individually, there is a said one voltage signal of one sense, at one of two possible logic levels, and a said other voltage signal, at the other of the two possible logic levels, in relation to what is considered to be the associated logic threshold mid-way therebetween. Said other voltage signal is considered to be complementary to said one voltage signal, although the associated pair of signals may not be at the same potentials, but of opposite sense. Said other voltage signal may be of the same sense as, but of a lower potential than, said one voltage signal, in relation to zero potential, or vice versa. Conveniently, common two possible logic levels are associated with each signal supplied to or provided by, the logic circuit, but this is not essential. Thus, there are associated pairs of inputs, and an associated pair of outputs, in relation to the logic circuit.

For convenience, in this specification, and the accompanying claims, each associated pair of inputs, and the associated pair of outputs, and each associated pair of signals, are referred to as being of differential form. Each differential input, or the differential output, is considered as providing a series of discrete differential signals, each differential signal comprising the difference between the potentials of the simultaneous, associated pair of voltage signals, and the pair of associated voltage signals being considered as comprising two constituent parts of the corresponding differential signals. It is convenient to consider voltage signals only at one or other of the two possible associated logic levels, so that a differential signal has a voltage equivalent to the difference in potentials between the two possible associated logic levels.

For each differential signal a logic "0" is provided by one constituent part of the differential signal being negative, and the other constituent part being positive, or said one part being more negative than said other part, and a logic "1" is provided by said one part being positive, or more positive than said other part; or vice versa. Thus, a bipolar transistor logic circuit to which the present invention relates may be arranged to operate in accordance with the positive, or the negative, logic convention.

There is associated with each associated pair of switching transistors, connected to a differential input, two possible input logic levels, and a corresponding input logic threshold mid-way therebetween. It is convenient to consider, only, that the same two possible input logic levels are associated with each differential input operated upon in a logic circuit as referred to above. In addition, it is convenient to consider that there is a differential output from each gating combination, comprising an associated pair of switching transistors, and in particular that this differential output is provided by the collectors of the associated pair of switching transistors, there being two possible output logic levels, and a corresponding output logic threshold mid-way therebetween, associated with each such gating combination. Inherently, in relation to each gating combination the input and output logic levels differ from each other. Further, corresponding output logic levels for adjacent constituent levels of the hierarchical arrangement differ from each by the equivalent of one base-emitter potential difference for the constituent switching transistors.

Because the arrangement of such a bipolar transistor logic circuit operates upon differential inputs, and, in response, provides a differential output, the logic circuit comprises, advantageously, a balanced arrangement. Thus, it operates satisfactorily irrespective of any common mode voltage associated with any differential input, or with the differential output, or with any differential output from a constituent gating combination within the logic circuit. The potential differences between pairs of logic levels of differential signals associated with the logic circuit do not vary with different loads for the logic circuit, or for the constituent gating combinations of the logic circuit.

A differential input, and the differential output, of a logic circuit as referred to above is considered as providing a series of discrete differential signals by there being a pulse repetition rate associated with possible changes in the input logic levels, or there being a sampling frequency, for the differential inputs supplied to the logic circuit, and the corresponding series of discrete differential output signals are considered as being provided in response to the logic circuit operating upon such discrete differential input signals.

It is an object of the present invention to provide noval and advantageous bipolar transistor logic circuits, each arranged to receive at least two differential inputs, and in response to provide a differential output.

According to the present invention a bipolar transistor logic circuit includes at least three gating combinations, in the form of a symmetrical hierarchical arrangement with a plurality of constituent levels, the highest level having only one gating combination, each gating combination comprises an associated pair of switching transistors, for each associated pair of switching transistors, considered individually, the emitters are connected together, and for the gating combination of the highest level of the hierarchical arrangement, the emitters are connected to a constant current source, and for each gating combination of each other constituent level of the hierarchical arrangement, except the highest level, the emitters are connected to a collector of an associated pair of switching transistors of the adjacent higher level of the hierarchical arrangement, the two collectors of the associated pairs of switching transistors of the highest level of the hierarchical arrangement, and at least one collector of each associated pair of switching transitors of each other level of the hierarchical arrangement, except the lowest level, being connected individually to the emitters of an associated pair of switching transistors of the adjacent lower level of the hierarchical arrangement, the arrangement is such that differential inputs to the logic circuit are received by transistor bases, and the arrangement is such that a differential input is to be supplied individually to each of the constituent levels of the hierarchical arrangement, and different differential inputs are supplied to different constituent levels of the hierarchical arrangement, in response to the differential inputs a corresponding differential output is provided on two lines of the logic circuit, the two lines being at least coupled, selectively, to the collectors of associated pairs of switching transistors of at least the lowest level of the hierarchical arrangement, all the collectors of the associated pairs of input transistors of the lowest level of the hierarchical arrangement being coupled selectively to one or other of the two output lines, and switching means is provided for the constant current source, to enable the logic circuit to be driven ON and OFF.

Usually a logic circuit is arranged to be faster in operation then any required rate at which each input is capable of changing between the associated two possible input logic levels, for example, an input pulse repetition rate, or the rate at which the inputs are required to be sample. Because of the operating characteristics referred to above, it is possible to arrange that the logic circuit is rendered inoperable by being driven OFF, and not merely quiescent, for the major portion of each period associated with an input pulse repetition rate, or an input frequency sampling rate. Hence, the logic circuit consumes less energy than it would otherwise consume, and less energy than a logic circuit which is merely quiescent when not required to operate upon inputs.

The operation of the switching means may be controlled by a clock pulse generator, the clock pulse generator being arranged to control also the rate at which each differential input is capable of changing between the associated two possible input logic levels.

When any logic circuit in accordance with the present invention is driven OFF, the collectors of all the bipolar switching transistors of the lowest level of the hierarchical arrangement are at the potential of the adjacent supply rail of the logic circuit. Hence, both the output lines are at the same potential, considered to be the logic threshold of the differential output, and in the absence of any interfacing means, this potential is also that of the supply rail, but changes when the logic circuit is driven ON. It is convenient to consider that the logic circuit is in equilibrium when driven OFF, and, further, it is convenient to consider that each of the constituent gating combinations, similarly, is in equilibrium. When the differential inputs are supplied, and the logic circuit is driven ON, the differential output varies half as far from the, variable, logic threshold than if the differential output had been established previously, but was of the wrong sense. Further, because the logic circuit comprises a symmetrical arrangement, the differential output inherently is started to be set up in the appropriate sense. In addition, each constituent gating combination varies from its equilibrium condition, and the appropriate change in the collector potentials of the associated pair of switching transistors inherently starts to take place in the appropriate sense. Hence, the remainder of the logic circuit can begin to operate upon such variation from the equilibrium condition of any gating combination, without waiting for the logic levels, on either side of the logic threshold associated with the gating combination, to become fully established. Thus, the logic circuit is inherently fast in operation.

When the logic circuit comprises, for example, an OR gate in accordance with the negative logic convention, previously it has been known to provide only one pair of input switching transistors, arranged to receiver a differential input to the logic circuit, in each constituent level of the hierarchical arrangement, and one collector of each level, other than the lowest level, but including the highest level, is not connected to the emitters of such an associated pair of input switching transistors, but instead is connected directly to the output lines of the logic circuit, the hierarchical arrangement is non-symmetrical in form.

However, for a logic circuit in accordance with the present invention, and when switching means is provided for the constant current source, to enable the logic circuit to be driven ON and OFF, it is required that the hierarchical arrangement of the logic circuit is symmetrical in form, to ensure that, when the logic circuit is driven ON, and the differential inputs are supplied, the corresponding differential output signals each initially vary from the varying output logic threshold in the appropriate sense.

Thus, for any form of logic circuit in accordance with the present invention, when switching means is provided for the constant current source, to enable the logic circuit to be driven ON and OFF, and when otherwise the hierarchical arrangement is not inherently symmetrical in form, there being only one pair of input switching transistors, arranged to receive a differential input to the logic circuit in each constituent level of the hierarchical arrangement, there is provided in each constituent level of the hierarchical arrangement, other than the highest level, an associated pair of switching transistors, not arranged to receive a differential input to the logic circuit, and so not comprising input switching transistors, but arranged to provide a hierarchical arrangement with a quasi-symmetrical form, for each such associated pair of switching transistors, considered individually, the base of one of the associated pair of switching transistors is connected to a constant current source, via the switching means, the emitters are connected together, and, for the next to highest level of the hierarchical arrangement, are connected to a collector of the pair of input switching transistors of the highest level, and for each other such associated pair of transistors, are connected to a collector of such an associated pair of transistors of the adjacent higher level of the hierarchical arrangement, each collector of each associated pair of switching transistors, not connected to the emitters of an associated pair of switching transistors, instead being connected individually to the two output lines of the logic circuit or being coupled to the two output lines by such a transistor. Such a quasi-symmetrical form for the hierarchical arrangement, for convenience, is considered in this specification, and the accompanying claims, to be a symmetrical form, because it avoids the disadvantage of non-symmetrical forms of hierarchical arrangements referred to in the preceding paragraph, namely, that otherwise, the differential output signals initially can vary from the varying ouput logic threshold in the wrong sense. Also for convenience, and where appropriate, in this specification and the accompanying claims, each associated pair of switching transistors not arranged to receive a differential input, is considered to be a dummy pair of input switching transistors, otherwise equivalent to an associated pair of input switching transistors.

The arrangement of the logic circuit may be such that for each differential input, and the differential output, considered individually, the potential difference between the associated two possible logic levels may be small, for example, being approximately 0.1 volt, so that the logic circuit has a lower speed-power product than otherwise would be the case.

If the two possible output logic levels of a logic circuit in accordance with the present invention are to be the same as the two possible input logic levels associated with each differential input, the output lines on which the differential output form the logic circuit is provided are coupled to the collectors of associated pairs of switching transistors of at least the lowest level of the hierarchical arrangement via interfacing means. Conveniently, the required interfacing means comprises at least an emitter follower between a collector, or the common connection of a plurality of collectors, of associated pairs of switching transistors of at least the lowest level of the hierarchical arrangement, and the associated output line, and a constant current source is connected to a point between the emitter follower and the output line, different such combinations, each having at least an emitter follower and a constant current source, being associated individually with the two output lines. If the hierarchical arrangement has two constituent levels, only the emitter followers are provided between the collectors of the transistors of at least the lower level and the output lines, but if the hierarchical arragement has three constituent levels, a diode is provided between each emitter follower and the associated output line.

For any form of logic circuit in accordance with the present invention, with switching means provided for each constituent constant current source, to enable the logic circuit to be driven ON and OFF, the logic circuit may include a latch having two parallel arms, in each arm is provided a bipolar input transistor, the base of which input transistor is arranged to receive a differential input part for the latch from the remainder of the logic circuit, and the emitter of the input transistor is coupled to a bipolar switching transistor, the collectors and bases of the two bipolar switching transistors, of the two arms of the latch, and not comprising input transistors, are cross-coupled, and the emitters of the two cross-coupled transistors are connected together, and are connected to two, parallel, constant current sources, the current associated with one such constant current source is arranged to be insufficient to drive the latch, but is sufficient to maintain the latch set, after it previously had been set, whilst the current associated with the other such constant current source is arranged to be sufficient to drive the latch, to render it capable of being set, or rest, if required, in response to, respectively, differential input signals to the latch, or a change thereof, and, whereas said one constant current source is connected directly to the emitters of the cross-coupled transistors, said other constant current source is coupled to the emitters of the cross-coupled transistors via the switching means. When only the current associated with said one constant current source is flowing in the emitter circuits of the cross-coupled transistors, the latch is considered to be in a quiescent state. Whilst consuming a finite amount of energy when in the quiescent state, the latch consumes less energy in the quiescent state than when the current associated with said other constant current source is flowing in the emitter circuits of the cross-coupled transistors, and the latch is capable of being set, or reset.

In accordance with another aspect the present invention comprises a combination of a plurality of series-connected bipolar transistor logic circuits, each constituent series-connected logic circuit having any form in accordance with the present invention, with switching means provided for each constituent constant current source, to enable the logic circuit to be driven ON and OFF, and when the hierarchical arrangement has a symmetrical, or quasi-symmetrical form, as referred to above, possibly, only the final logic circuit of the combination also including a latch as referred to above. In relation to such a non-combinatorial system, there being no latches, or other form of memory device, between the series-connected logic circuits, and the system being considered as a whole, when the logic circuits are driven ON, and the differential inputs are supplied thereto, the system operates in a similar manner to each constituent logic circuit, as referred to above. In particular, for each logic circuit, each constituent gating combination varies from its equilibrium condition when the logic circuit is driven ON, and it is inherent that the appropriate change in the collector potentials of the associated pair of switching transistors inherently starts to take place in the appropriate sense. Hence, within the non-combinatorial system each constituent logic circuit varies from its equilibrium condition, in this manner, as soon as the differential inputs thereto begin to become established, and the logic circuits are driven ON. In particular, the differential inputs to each series-connected logic circuit, after the first, inherently, initially, begin to become established in the appropriate sense, so that the logic circuit can begin operating upon these differential inputs before the associated input logic levels of these differential inputs have become fully established. Hence, in the non-combinatorial system high equivalent gate speeds are obtained, and the overall system delay is less than the sum of the delays of the series-connected logic circuits.

In accordance with still another aspect the present invention comprises a semiconductor device, having, embodied within a monolithic semiconductor body, a so-called uncommitted gate array, and in which each of a plurality of constituent cells of the device is at least partially in the form of a symmetrical, or quasi-symmetrical, hierarchical arrangement of a bipolar transistor logic circuit as referred to above, and the arrangement of the cell is such that there is the ability to provide at least some of the required electrical interconnections of a logic circuit of a desired form, and as referred to above, on the surface of the semiconductor body, in a known discretionary manner. Thus, any form of logic circuit referred to above may be obtained.

Figure 2:
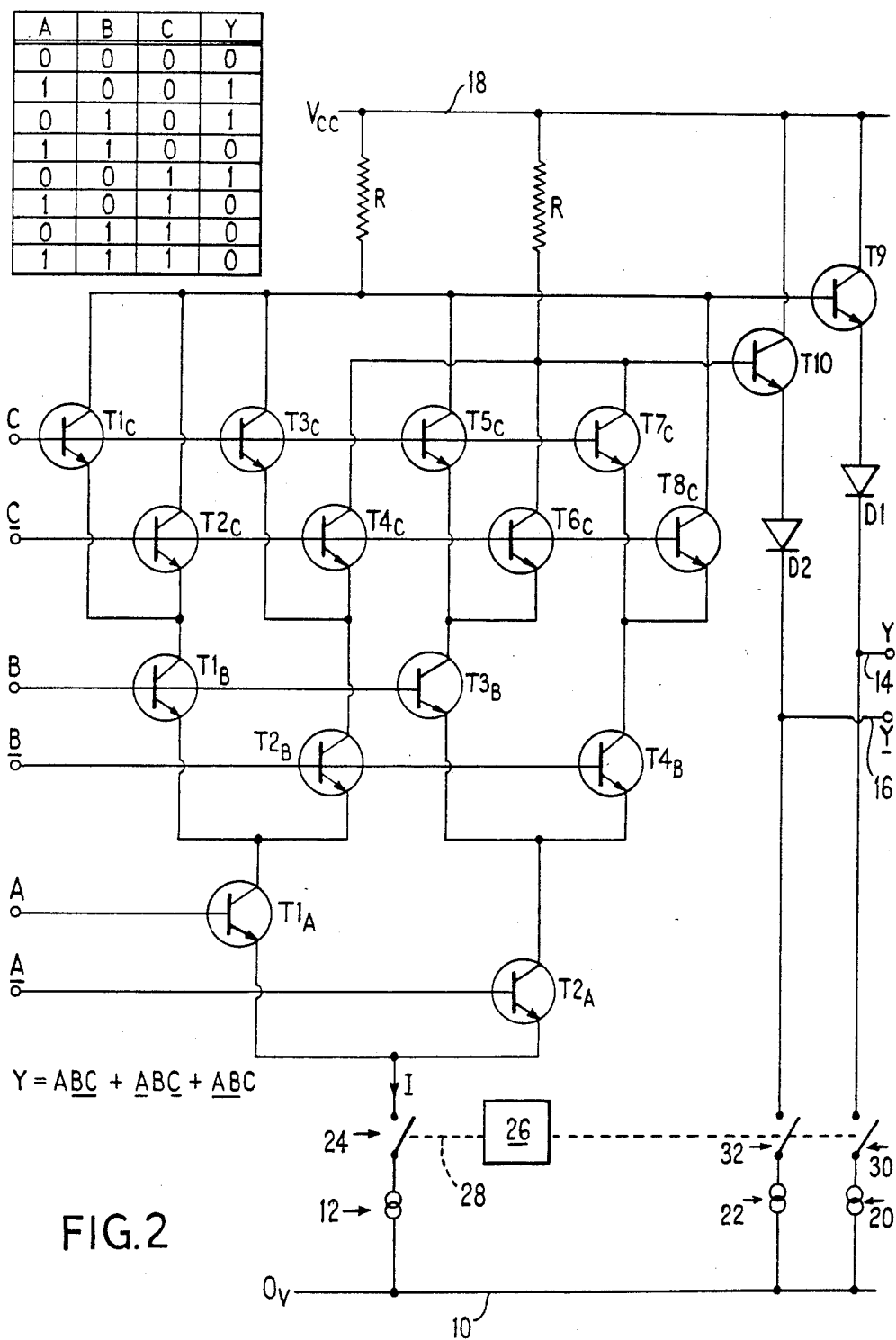
Figure 3:
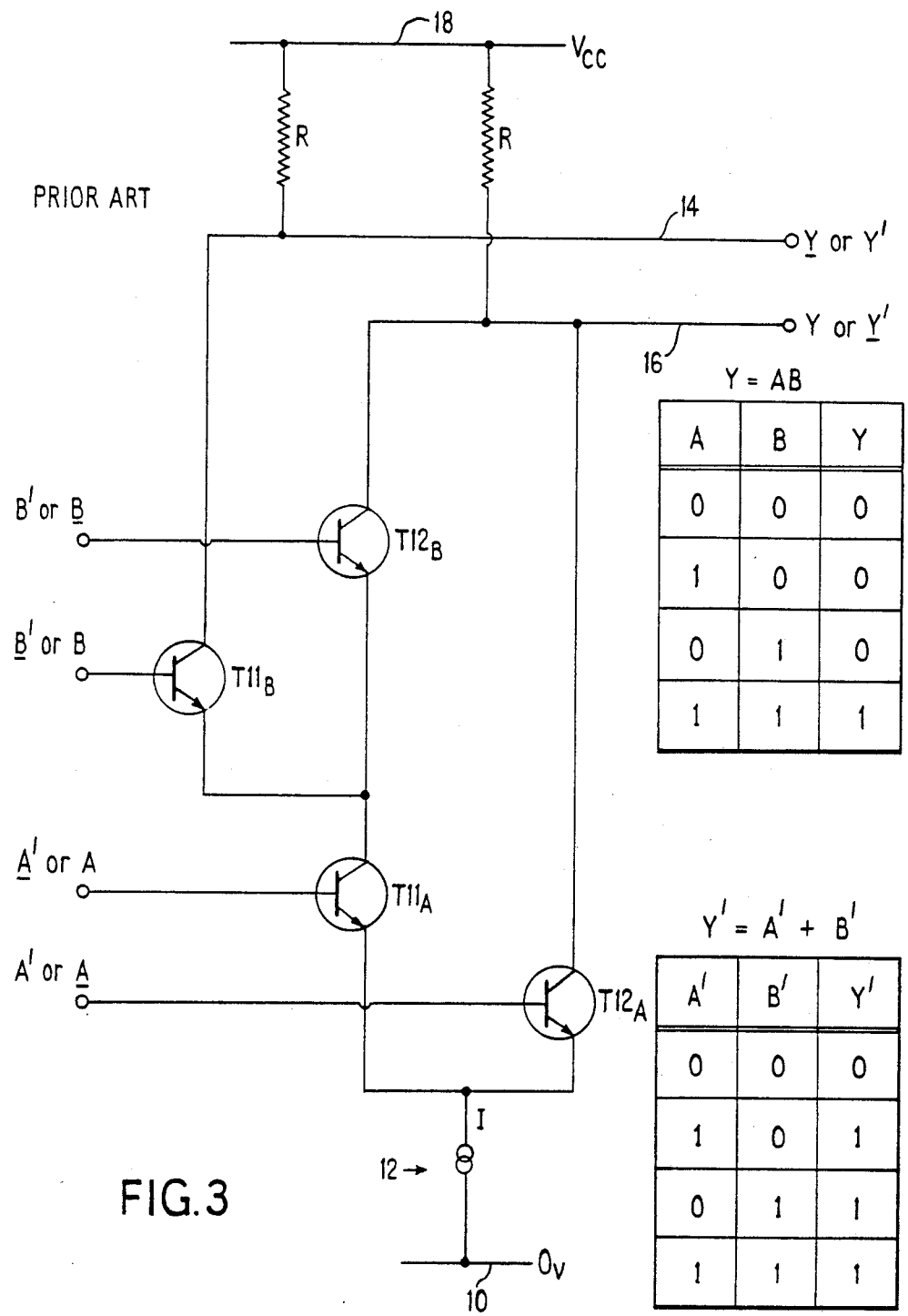
Figure 4:
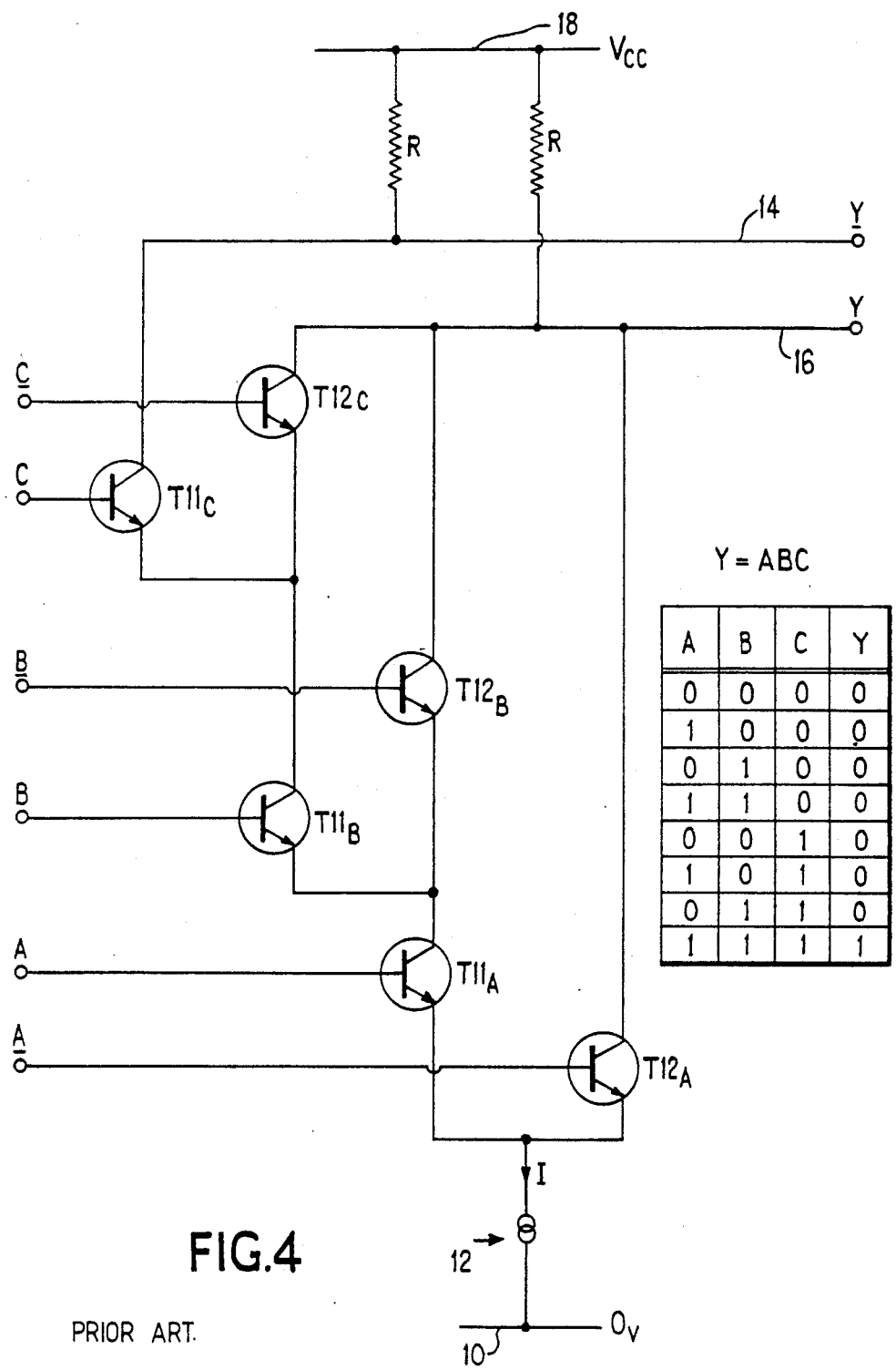
Figure 5:
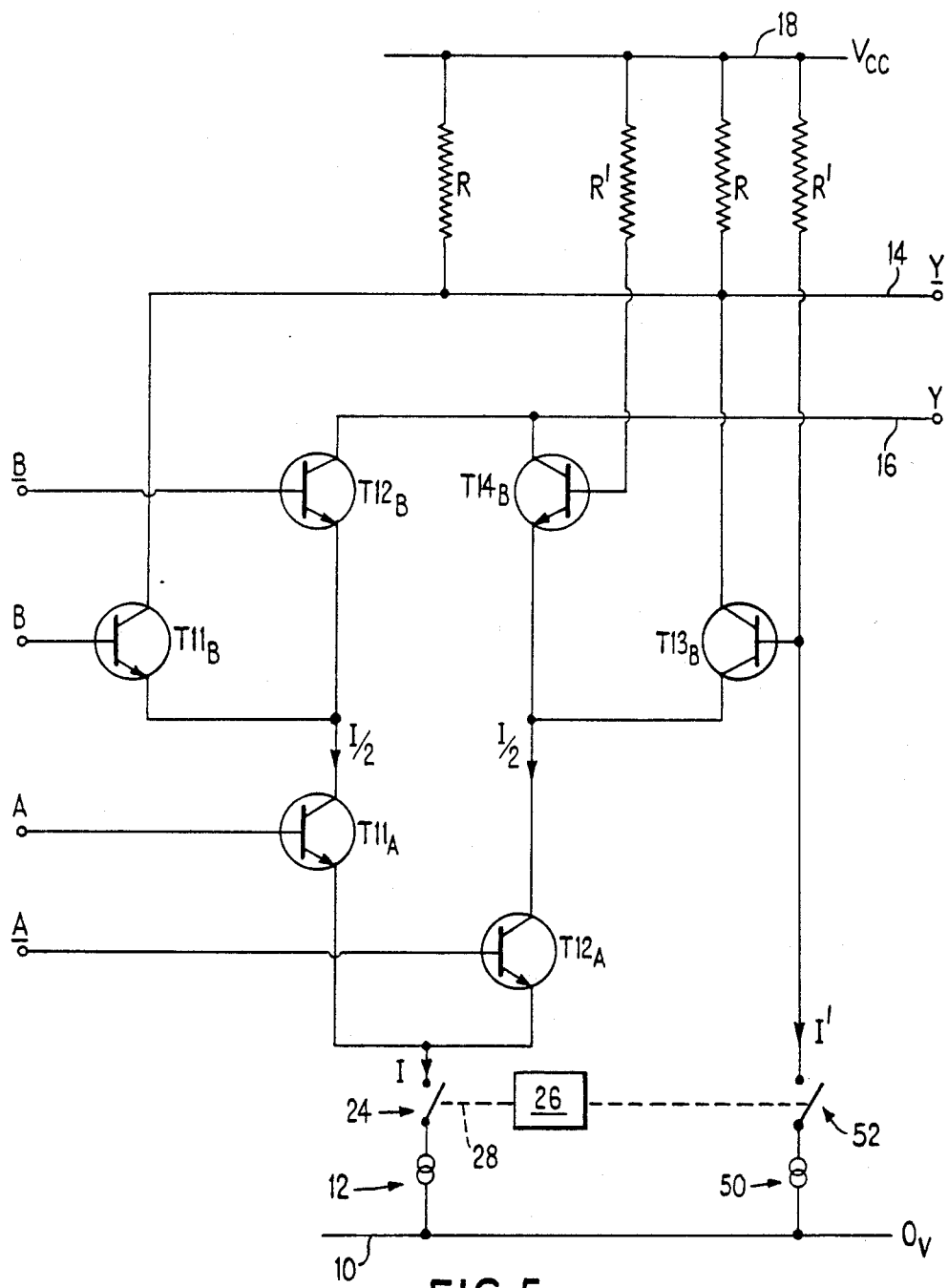
Figure 6:
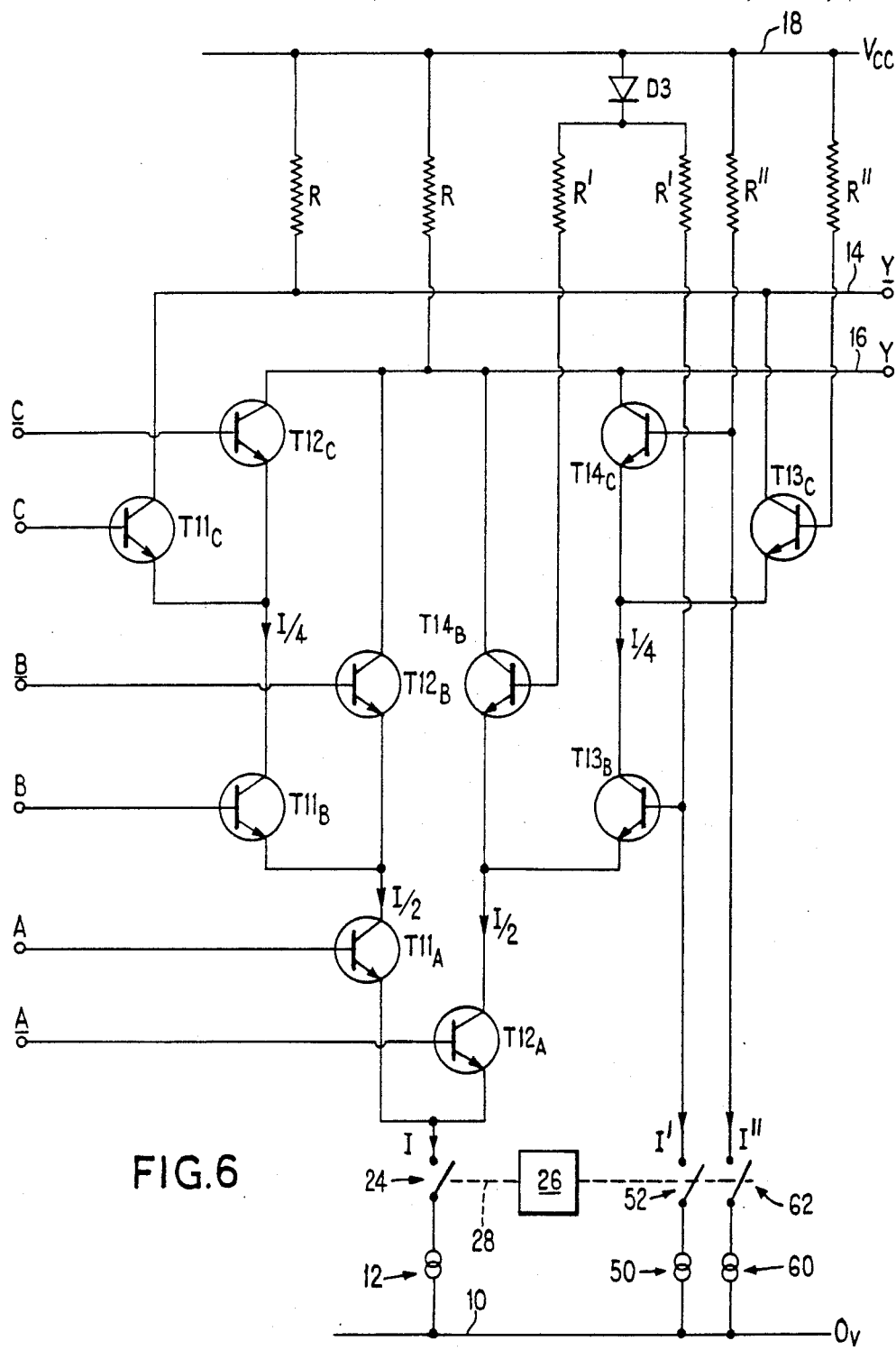
Figure 7:
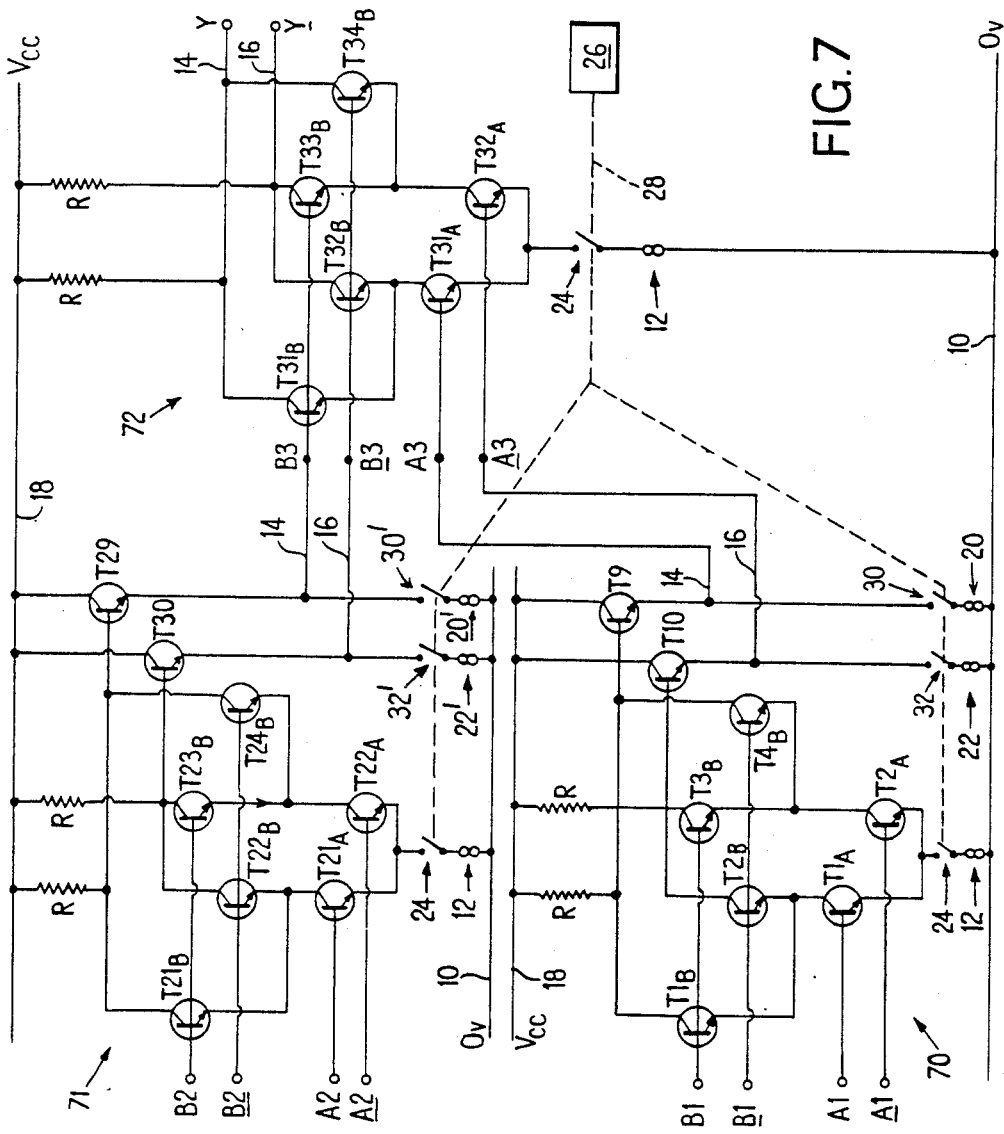
Figure 8:
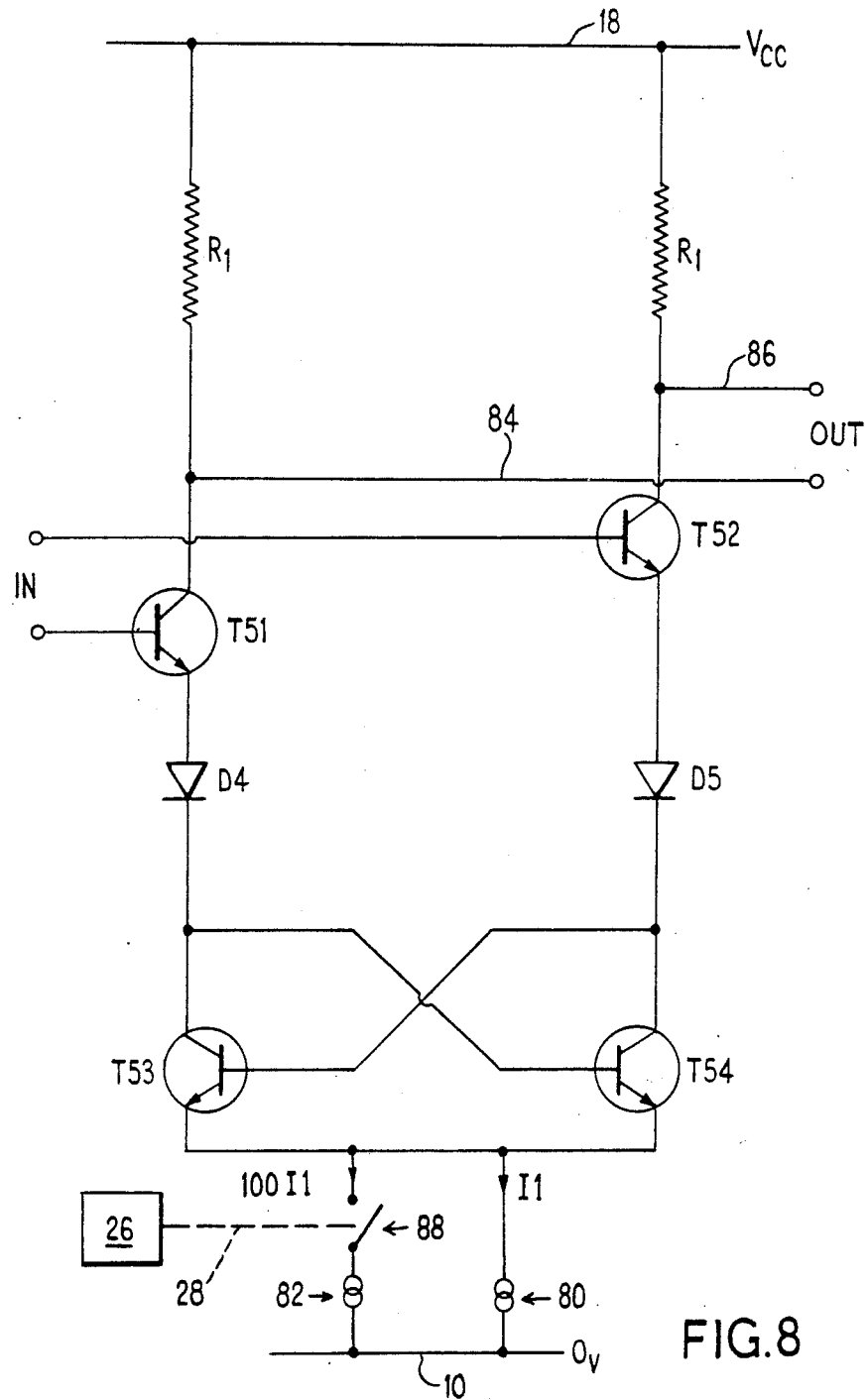

The present invention will now be described by way of example with reference to the accompanying drawings, in which FIG. 1 is a circuit diagram of a known bipolar transistor logic circuit in the form of a two input Exclusive OR gate, in accordance with the negative logic convention, and including a constant current source to drive the logic circuit, FIG. 2 corresponds to FIG. 1, but is of a three input Exclusive OR gate, and, in particular, comprises one embodiment in accordance with the present invention, including switching means for the constant current source, to enable the logic circuit to be driven ON and OFF, FIG. 3 is a circuit diagram of a known two input OR gate, or a two input AND gate, in accordance with the negative logic convention, FIG. 4 corresponds to FIG. 3, but is of a three input gate, FIG. 5 is of a modification to the logic circuit shown in FIG. 3, and comprising another embodiment in accordance with the present invention, FIG. 6 shows a modification to the logic circuit shown in FIG. 4 equivalent to the modification shown in FIG. 5, FIG. 7 is of an arrangement of gates, each gate being of the form substantially as shown in FIG. 2, within the arrangement constituent gates being connected in series, and FIG. 8 is a circuit diagram of a latch suitable for inclusion within a logic circuit in accordance with the present invention.

The known logic circuit shown in FIG. 1, includes three gating combinations of NPN, bipolar switching transistors, each gating combination comprising an associated pair of input transistors. The arrangement is such that two differential inputs are to be supplied to the logic circuit. The two parts of one differential input, designated A and $\bar{A}$, are supplied individually to the bases of one of the associated pair of transistors, respectively, $T1_A$ and $T2_A$. The two parts of the other differential input, designated B and $\bar{B}$, are supplied individually to the bases of each of the other two associated pairs of transistors, respectively, $T1_B$ and $T2_B$, and $T3_B$ and $T4_B$. The emitters of each associated pair of transistors, considered individually, are connected together. The collector of the transistor $T1_A$ is connected to the coupled emitters of the associated pair of transistors $T1_B$ and $T2_B$, and the collector of the transistor $T2_A$ is connected to the coupled emitters of the associated pair of transistors $T3_B$ and $T4_B$, providing a hierarchical arrangement with two constituent levels. The two differential inputs are supplied, individually, to the two constituent levels of the hierarchical arrangement. The coupled emitters of the associated pair of transistors $T1_A$ and $T2_A$ are connected to a rail 10 maintained at zero potential, via a constant current source, indicated generally at 12, and to drive the logic circuit. A current I, for example, of 1 milliampere, is shown entering the constant current source 12 when the logic circuit is operating. The collectors of the transistors $T1_B$ and $T3_B$, which transistors are to receive the differential input part B, are connected to an output line 14 of the logic circuit, and the collectors of the transistors $T2_B$ and $T4_B$, which transistors are to receive the differential input part $\bar{B}$, are connected to an output line 16. In response to the differential input A, $\bar{A}$, and B, $\bar{B}$, there is provided a corresponding differential output having the constituent parts Y and $\bar{Y}$, respectively, on the lines 14 and 16. The two possible logic levels associated with both the differential inputs A, $\bar{A}$, and B, $\bar{B}$, are the same. The logic circuit is completed by the lines 14 and 16 both being connected individually to a rail 18, maintained at a potential Vcc, for example, +5 volts, via resistors R.

In operation, the logic circuit comprises an Exclusive OR gate in accordance with the negative logic convention. Thus, when both the differential input parts A and B; $\bar{A}$ and $\bar{B}$, simultaneously are at the same input logic levels for the differential inputs, of the two possible input logic levels for these differential input parts, the differential output part Y is at the more negative of the two possible output logic levels, and the differential output part Y simultaneously is at the more positive of the two possible output logic levels, for these differential output parts. However, when the differential input parts A and B, A and B, simultaneously are at different input logic levels, the simultaneous logic levels of the differential output parts Y and Y are reversed, Y being the more positive, and Y being the more negative. This can be expressed as $Y = AB + AB.$ As described above in relation to the logic circuit of FIG. 1, and as is general for any such logic circuit having differential inputs and a differential output, the logic circuit comprises a hierarchical arrangement of gating combinations, each gating combination comprising an associated pair of bipolar switching transistors, the hierarchical arrangement having at least two constituent levels, with different inputs being associated individually with different levels of the hierarchical arrangement. A differential input of one level of the hierarchical arrangement partially masks the differential input, or inputs, of lower levels. Hence, in relation to the logic circuit of FIG. 1 the differential input A, A partially masks the differential input B, B.

It is convenient to consider that within the logic circuit, not only do the differential inputs and the differential output have two possible logic levels associated therewith, but that each constituent gating combination of an associated pair of switching transistors also have two possible output logic levels associated therewith, in the collector circuits of the transistors. In particular, this can be considered to apply to the collector circuits of the associated pair of switching transistors $T1_A$ and $T2_A$ of the higher level of the hierarchical arrangement of FIG. 1.

Any form of such a logic circuit is arranged such that the switching transistors do not saturate under normally-encountered operating conditions.

Any such logic circuit is advantageous in that it is balanced in operation. Thus, it operates satisfactorily irrespective of any common mode voltage associated with any differential input, or with the differential output, or with any differential output from a constituent gating combination within the logic circuit. The potential differences between pairs of logic levels of differential signals associated with the logic circuit do not vary with different loads for the logic circuit, or for the constituent gating combinations of the logic circuit.

A further advantage, following from the advantage stated in the preceding paragraph, is that for each differential signal associated with the logic circuit, the potential difference between the associated two possible logic levels may be small, for example, being approximately 0.1 volt. This implies that the logic circuit has a lower speed-power product than otherwise would be the case.

Yet another advantage is the low energy consumption of such a logic circuit. This is because the logic circuit includes a hierarchical arrangement of gating combinations, and one constant current source is shared by the associated pairs of switching transistors of the constituent levels of the hierarchical arrangement. It may be possible to drive up to twelve associated pairs of switching transistors from one constant current source.

In addition less energy is consumed than in an equivalent logic circuit not constructed in accordance with the present invention because, inherently, fewer switching transistors are required in the logic circuit in accordance with the present invention.

For one particular embodiment of a logic circuit as described with reference to FIG. 1, the delay associated therewith is 1.3 nanosecond.

The logic circuit described above with reference to FIG. 1 comprises an Inclusive AND gate in accordance with the positive logic convention.

Further, inversion for either such form of logic circuit may be obtained merely by reversing the supply of each associated pair of differential input parts, and considering the differential output parts reversed. With reference to the logic circuit illustrated in FIG. 1, such inversion can be represented merely by considering that the differential output part Y is associated with the line 14, the differential output part Y is associated with the line 16, the differential part A is supplied to the transistor $T2_A$, the differential input part A is supplied to the transistor $T1_A$, and the supplies to the transistors $T1_B$, $T2_B$, $T3_B$ and $T4_B$ similarly are reversed. Thus, an Exclusive NOR gate is obtained in accordance with the negative logic convention, and this may be expressed by $Y' = A'B' + A'B'.$ Similarly an Inclusive N AND gate is obtained in accordance with the positive logic convention.

Such inversion may be obtained in the same way for any logic circuit having differential inputs and a differential output, and comprising a hierarchical arrangement of gating combinations, for example, to obtain either a two input OR gate, or a two input AND gate, both in accordance with the negative logic convention, and as described below in relation to FIG. 3.

The three input Exclusive OR gate shown in FIG. 2, and in accordance with the present invention, corresponds to that shown in FIG. 1, and identical, or closely resembling, constituent components, and lines and rails are designated in the same way in both Figures.

The logic circuit of FIG. 2 differs from that of FIG. 1 in that the hierarchical arrangement has three constituent levels. The higher two constituent levels are identical with the two constituent levels of the logic circuit of FIG. 1. The lowest level comprises four gating combinations each comprising an associated pair of input transistors, with their emitters connected together. Of the transistors of the intermediate level, the collector of the transistor $T1_B$ is connected to the coupled emitters of transistors $T1_C$ and $T2_C$ of the lowest level, the collector of transistor $T2_B$ is connected to the emitters of the transistor $T3_C$ and $T4_C$, the collector of transistor $T3_B$ is connected to the emitters of transistors $T5_C$ and $T6_C$, and the collector of transistor $T4_B$ is connected to the emitters of transistors $T7_C$ and $T8_C$. The bases of the transistors $T1_C$, $T3_C$, $T5_C$ and $T7_C$ are arranged to receive a part C of a third differential input to the logic circuit, and the bases of the transistors $T2_C$, $T4_C$, $T6_C$ and $T8_C$ are arranged to receive a part C of the third differential input. The collectors of the five transistors $T1_C$, $T2_C$, $T3_C$, $T5_C$ and $T8_C$ of the lowest level of the hierarchical arrangement are connected to the line 14 on which is considered to be provided the differential output part Y, and the collectors of the three transistors $T4_C$, $T6_C$ and $T7_C$ of the lowest level of the hierarchical arrangement are connected to the line 16 on which is considered to be provided the differential output part Y. The remaining portions of the logic circuit of FIG. 1 are identical to the corresponding portions of the logic circuit of FIG. 2. The two possible logic levels associated with the differential input C, C are the same as those associated with the differential inputs A, A and B, B. The logic circuit of FIG. 2 operates in a similar manner to the logic circuit of FIG. 1.

However, in the operation of the logic circuit of FIG. 2, the differential output part Y is at the more positive of the two possible output logic levels, and the differential output part Y simultaneously is at the more negative of these output logic levels, when the differential input parts A, B and C, or A, B and C, or A, B and C, simultaneously are at the more positive of the two possible input logic levels, and simultaneously, and respectively, the differential input parts A, B and C or A, B and C, or A, B and C, are at the more negative input logic level. For any other simultaneous set of logic levels relating to the three differential inputs, the differential output part Y is at the more negative output logic level, and simultaneously the differential output part Y is at the more positive output logic level. This can be expressed as $$Y = ABC + ABC + ABC.$$

Again such a logic circuit is advantageous in that it is balanced in operation, and operates satisfactorily irrespective of any common mode voltage associated with any differential input, or the differential output, of the logic circuit, or any differential signal within the logic circuit.

However, because for both the logic circuit of FIG. 1, and the logic circuit of FIG. 2, the collector circuits of the switching transistors of the lowest level of the hierarchical arrangement, when at the more positive of the two associated logic levels, is required to be at Vcc potential, if the differential output is required to be supplied directly to, for example, another such logic circuit having the same supply rails 10 and 18, as a differential input to the other logic circuit, interfacing means is required between the two logic circuits, so that the input logic levels supplied to the other logic circuit have the same values for both logic circuits. The interfacing means required for a three level hierarchical arrangement is shown in FIG. 2, and comprises an emitter follower transistor T9 in series with both a diode D1 and an auxiliary constant current source 20, between the collectors of the transistors $T1_C$, $T2_C$, $T3_C$ $T5_C$ and $T8_C$ associated with the differential output part Y, and the rail 10 maintained at zero potential. Thus, the base of the transistor T9 is connected to the collectors of the transistors $T1_C$, $T2_C$, $T3_C$, $T5_C$ and $T8_C$, and the collector of the transistor T9 is connected to the rail 18 maintained at the potential Vcc. Similarly a series combination of an emitter follower transistor T10, with both a diode D2 and an auxiliary constant current source 22, is provided between the collectors of the transistors $T4_C$, $T6_C$ and $T7_C$ associated with the differential output part Y, and the rail 10. The differential output parts, having the required output logic levels associated therewith are supplied on the line 14 connected to a point between the diode D1 and the auxiliary constant current source 20; and on the line 16 connected to a point between the diode D2 and auxiliary constant current source 22.

The interfacing means required for the two level hierarchical arrangement of FIG. 1 is similar to that shown in FIG. 2, except that the diodes D1 and D2 are omitted, as shown in FIG. 5.

Usually using interfacing means is provided in a logic circuit in accordance with the present invention, but for convenience will not be referred to in relation to any other logic circuit described in this specification, except those described in relation to FIG. 7.

Usually a logic circuit is arranged to be faster in operation than any required rate at which each input is capable of changing between the associated two possible input logic levels, for example, the input pulse repetition rate, or the rate at which the inputs are required to be sampled. Usually any such rate has a constant value. Thus, for example, the logic circuit may be required to be operating upon the inputs for only one-tenth of the period between, say, consecutive sampling of the inputs. Because of the operating characteristics of a logic circuit referred to above, it is possible to arrange that the logic circuit is rendered inoperable, and not merely quiescent, for, say, nine-tenths of each period between each consecutive sampling of the inputs. In such an inoperable state the logic circuit in accordance with the present invention only dissipates leakage currents. Hence, the logic circuit consumes, on average, only one-tenth of the energy it otherwise would consume, and less energy than a logic circuit which is merely quiescent when not required to operate upon inputs.

Generally in accordance with the present invention, the logic circuit is driven ON and OFF, by switching means being provided for the constant current source, indicated for the logic circuit of FIG. 2, by way of example, by the provision of a switch 24 between the constant current source 12 and the coupled emitters of the transistors $T1_A$ and $T2_A$ of the highest level of the hierarchical arrangement, and by the provision of a clock 26 to control the opening and closing of the switch 24. The appropriate control exercised by the clock 26 over the operation of the switch 24 is represented by the inclusion of the dotted line 28 in FIG. 2. Usually the switch 24 comprises a bipolar switching transistor. It is convenient to arrange that the logic circuit is driven ON and OFF in synchronism with, for example, the pulse repetition rate at which the differential inputs are capable of changing between the associated two possible input logic levels, or the constant rate at which the differential inputs are required to be sampled, or a suitable multiple thereof. Hence, the opening and closing of the switch 24 is controlled in synchronism with the possible changes in the input logic levels by the clock 26, also being employed to control the sampling of, or the pulse repetition rate of, the differential inputs. For example, the driving ON and OFF of the logic circuit is at the same clock frequency as, and is arranged to be in phase with, the possible changes in the input logic levels. It may be convenient to have each simultaneous set of the required input logic levels, to be operated upon by the logic circuit, to be established individually before the logic circuit is driven ON.

The auxiliary constant current sources 20 and 22 of the interfacing means are also required to be switched ON and OFF in synchronism with the constant current source 12. For this purpose switches, each possibly comprising a bipolar switching transistor, and indicated generally at 30 and 32, are provided respectively between the auxiliary constant current source 20 and the line 14, and between the auxiliary constant current source 22 and the line 16. The operations of the switches 30 and 32 are also controlled by the clock 26, represented by the inclusion of the dotted line 28 in FIG. 2.

A feature of any logic circuit in accordance with the present invention, when the logic circuit is driven OFF, is that the collectors of all the bipolar switching transistors of the lowest level of the hierarchical arrangement are at the potential Vcc of the rail 18. Hence, both the output lines 14 and 16 are at the same potential, considered to be the logic threshold of the differential output, and in the absence of any interfacing means, this potential is also Vcc. When the differential inputs are supplied, and the logic circuit, of a symmetrical construction such as shown in or FIG. 2, is driven ON, the appropriate differential output inherently is started to be set up in the appropriate sense, and varies half as far from the logic threshold than if the differential output had been established previously, but was of the wrong sense. Hence, it is convenient to consider that the logic circuit, and in particular the output of the logic circuit, is in equilibrium when driven OFF. When the logic circuit is driven ON, each gating combination of the lowest level of the hierarchical arrangement causes the differential output to vary, by a change in the collector potentials of the associated pair of switching transistors. In particular, for each such pair of associated switching transistors, one collector potential falls below Vcc, whilst the other collector potential remains substantially constant at Vcc. Thus the output logic threshold can be considered as varying when the logic circuit is driven ON, but this is without significance.

In addition, each constituent gating combination of the logic circuit can be considered to be in such an equilibrium condition when the logic circuit is driven OFF. Further, when the logic circuit of FIG. 2 is driven ON, and in response to the differential inputs, each gating combination, irrespective of which constituent level of the hierarchical arrangement it is in, varies from its equilibrium condition, it is inherent that the appropriate change in the collector potentials of the associated pair of switching transistors starts to take place in the appropriate sense. Hence, the remainder of the logic circuit can begin to operate upon such variation from the equilibrium condition of any gating combination, within a fraction of the time taken for the appropriate logic levels, on either side of the logic threshold associated with the gating combination, to become fully established. Thus, the potentials of the two output lines 14 and 16, when they begin to change, start to change in the appropriate sense, when the logic circuit is driven ON, and the differential inputs are supplied to the logic circuit, and when the logic circuit has a symmetrical form of construction, for example, as shown in FIG. 2. Hence, the logic circuit is inherently fast in operation.

The two input OR gate, in accordance with the negative logic convention, and shown in FIG. 3, is similar to the two input Exclusive OR gate of FIG. 1, and identical, or closely resembling, constituent components, and lines and rails, are designated in the same way in both Figures. The logic circuit of FIG. 3 comprises gating combinations of NPN bipolar switching transistors, having associated pairs of input transistors, in different constituent levels of a hierarchical arrangement. Whilst the hierarchical arrangement of FIG. 3 has two constituent levels, the same as the hierarchical arrangement of FIG. 1, however, it has only two, and not three, associated pairs of input transistors, the lower level of the hierarchical arrangement having only one such associated pair of input transistors. Hence, the hierarchical arrangement is not symmetrical as required for a logic circuit in accordance with the present invention. Thus, the transistors T3$_B$ and T4$_B$ are omitted in the logic circuit of FIG. 3, the differential input parts B and B being supplied to only one associated pair of input transistors, respectively, T11$_B$ and T12$_B$. In order further to distinguish the logic circuit of FIG. 3 from that of FIG. 1, the transistors T1$_A$, T2$_A$, T1$_B$ and T2$_B$ of FIG. 1 are designated, respectively, T11$_A$, T12$_A$, T11$_B$ and T12$_B$ in FIG. 3. In particular, the emitters of the associated pair of transistors T11$_B$ and T12$_B$ of the lower level of the hierarchical arrangement are connected to the collector of the transistor T11$_A$ of the higher level, and the collector of the other transistor T12$_A$ of the higher level is connected directly to the line 16. For the sake of clarity, the line 14 of FIG. 3 is shown as being associated with the differential output part Y, and the line 16 is shown associated with the differential output part Y, instead of the reverse arrangement shown in FIG. 1, this alteration being without significance. Otherwise the logic circuit of FIG. 3 is illustrated as being identical to the logic circuit illustrated in FIG. 1, and operates in a similar manner.

However, in the operation of the logic circuit of FIG. 3, the differential output part Y is at the more positive of the two possible output logic levels, and the differential output part Y simultaneously is at the more negative of these output logic levels, only when both the differential input parts A and B, simultaneously, are at the more positive of the two possible input logic levels, and the other differential input parts A and B, simultaneously, are at the more negative of the two possible input logic levels. For any other simultaneous set of logic levels relating to the two differential inputs, the differential output part Y is at the more negative output logic level, and simultaneously the differential output part Y is at the more positive output logic level. This can be expressed as $Y = AB$.

Again, inversion for this logic circuit is obtained by reversing the supply of each associated pair of differential input parts, and by considering the differential output parts reversed. Hence, a two input AND gate, in accordance with the negative logic convention, is obtained by a differential input part A' being supplied to the transistor T12$_A$, a differential input part A' being supplied to the transistor T11$_A$, a differential input part B' being supplied to the transistor T12$_B$, and a differential input part B' being supplied to the transistor T11$_B$. The differential output part Y' is supplied on the line 16, and the differential output part Y' is supplied on the line 14. In the operation of the logic circuit the differential output part Y' is at the more positive of the two possible output logic levels, and the differential output part Y' simultaneously is at the more negative of these output logic levels, only when both the differential input parts A' and B', simultaneously, are at the more positive of the two possible input logic levels, and the differential input parts A' and B', simultaneously, are at the more negative of the two possible input logic levels. For any other simultaneous set of logic levels relating to the two differential inputs, the differential output part Y' is at the more negative output logic level, and simultaneously the differential output part Y' is at the more positive output logic level. This can be expressed as $Y' = A' + B'$.

The three input OR gate shown in FIG. 4 corresponds to that of FIG. 3, and identical, or closely resembling, constituent components, and lines and rails, are designated in the same way in both Figures.

The logic circuit of FIG. 4 differs from that of FIG. 3 in that the non-symmetrical hierarchical arrangement has three constituent levels. The higher two constituent levels are identical with the two constituent levels of the logic circuit of FIG. 3. The lowest level also comprises an associated pair of input transistors $T11_C$ and $T12_C$, with their emitters connected together. These emitters are connected to the collector of the transistor $T11_B$. The collector of the transistor $T11_C$ is connected to the output line 14, and the collector of the transistor $T12_C$ is connected to the output line 16. The collector of the other transistor $T12_B$ of the intermediate level of the hierarchical arrangement is connected directly to the output line 16. The base of the transistor $T11_C$ of the lower level of the hierarchical arrangement is arranged to receive a part C of a third differential input to the logic circuit, and the base of the other transistor $T12_C$ of the lower level is arranged to receive the other part C of the third differential input. The remaining portions of the logic circuit of FIG. 3 are identical with the corresponding portions of the logic circuit of FIG. 4. The logic circuit FIG. 4 operates in a similar manner to the logic circuit of FIG. 3.

In the operation of the logic circuit of FIG. 4, the differential output part Y is at the more positive of the two possible output logic levels, and the differential output part Y simultaneously is at the more negative of these output logic levels, only when the three differential input parts A, B and C, simultaneously, are at the most positive of the two possible input logic levels, and the other differential input parts A, B and C, simultaneously, are at the more negative of the two possible input logic levels. For any other simultaneous set of logic levels relating to the three differential inputs, the differential output part Y is at the more negative logic level, and simultaneously the differential output part Y is at the more positive output logic level. This could be expressed as Y=ABC.

By comparing the logic circuit of FIG. 3 with that of FIG. 1, and by comparing the logic circuit of FIG. 4 with that of FIG. 2, it can be seen that the constructions of the hierarchical arrangements of the Exclusive OR gates of FIGS. 1 and 2 are symmetrical in form, whereas the constructions of the hierarchical arrangements of the OR/AND gates of FIGS. 3 and 4 are not symmetrical. When the logic circuit is driven ON and OFF, and in order that the OR/AND gates are of a form desirable to be employed, in particular, in a non-combinatorial system, of switched logic circuits, such as that described above in relation to FIG. 7, it is required that these gates also are symmetrical in form.

The hierarchical arrangements of the OR/AND gates of FIGS. 3 and 4 are not considered to be symmetrical because there is only one pair of input switching transistors, arranged to receive a differential input to the logic circuit in each constituent level of each hierarchical arrangement.

FIG. 5 shows a quasi-symmetrical form of the hierarchical arrangement of the two input OR gate of FIG. 3. Identical, or closely resembling, constituent components, and lines and rails, are designated in the same way in both Figures. The logic circuit of FIG. 5 differs from that of FIG. 3 in that an additional, associated pair of switching transistors $T13_B$ and $T14_B$ is provided in the lower level of the hierarchical arrangement. The emitters of the transistors $T13_B$ and $T14_B$ are connected together, and are connected to the collector of the transistor $T12_A$ of the higher level of the hierarchical arrangement, which collector in the logic circuit of FIG. 3 is connected directly to the line 16. The collector of the transistor $T14_B$ is connected to the output line 14, and the collector of the transistor $T13_B$ is connected to the output line 16. However, the bases of the transistors $T13_B$ and $T14_B$, are not arranged to receive a differential input to the logic circuit, but these switching transistors are provided in order to make the hierarchical arrangement of the logic circuit quasi-symmetrical in form. The base of the transistor $T13_B$ is connected to the rail 10 maintained at zero potential via a second constant current source indicated generally at 50, a current I' being shown as flowing into the second constant current source 50, and this base is also connected to the rail 18 maintained at the potential Vcc, via a resistor R'. The base of the associated transistor $T14_B$ is also connected to the rail 18 via a resistor R'. The arrangement is such that the same current I/2 flows in the circuits of the coupled emitters of both associated pairs of transistors $T11_B$ and $T12_B$, and $T13_B$ and $T14_B$, of the lower level of the hierarchical arrangement. The logic circuit of FIG. 5 operates in a similar manner to the logic circuit shown in FIG. 3.

In accordance with the present invention a switch 24, controlled by a clock 26, is provided between the constant current source 12 and the emitters of the pair of transistors $T11_A$, $T12_A$ of the higher level of the quasi-symmetrical hierarchical arrangment. A switch 52 also controlled by the clock 26 is provided between the second constant current source 50 and the transistor $T13_B$.

The provision of the switching transistors $T13_B$ and $T14_B$ in the lower level of the hierarchical arrangement, and their associated constant current source 50, when the logic circuit is driven ON, and the differential inputs are supplied to the logic circuit, ensures that when the output logic levels of each differential output signal from the logic circuit starts to vary from the output logic threshold as referred to above, such variation is in the appropriate sense from the output logic threshold. Hence, for example, a following logic circuit, in a system equivalent to that shown in FIG. 7, can begin to operate upon such variations of differential output signals from the logic circuit, each such variation being from its output logic threshold, within a fraction of the time taken for the appropriate output logic levels, on either side of the output logic threshold, to become fully established. The feature, that the differential output signals initially vary from the output logic threshold in the appropriate sense, is inherent for logic circuits with hierarchical arrangements each with a symmetrical construction, for example, as shown in FIGS. 1 and 2, and for the logic circuit shown in FIG. 5 with the quasi-symmetrical construction for the hierarchical arrangement.

It is not essential that the logic circuit of FIG. 5 is to be included within a non-combinatorial system.

FIG. 6 shows a quasi-symmetrical form of the hierarchical arrangement of the three input OR gate of FIG. 4, and closely resembles the quasi-symmetrical form of the two input OR gate of FIG. 5. Identical, or closely resembling, constituent components, and lines and rails, are designated in the same way in the three FIGS. 4, 5 and 6. The logic circuit of FIG. 6 differs from that of FIG. 5 in that an additional, associated pair of switching transistors $T13_C$ and $T14_C$, are provided in the lowest of the three levels of the hierarchical arrangement, to match with the associated pair of input switching transistors $T11_C$ and $T12_C$, shown in FIG. 4 in this level. Similar to the arrangement in relation to the associated pair of switching transistors $T13_B$ and $T14_B$ provided in the intermediate level of the hierarchical arrangement, the emitters of the transistors $T13_C$ and $T14_B$ are connected together, and are connected to the collector of transistor $T13_B$ of the intermediate level of the hierarchical arrangement, which collector in the logic circuit of FIG. 5 is connected directly to the output line 14. The collector of the transistor $T13_C$ is connected directly to the output line 14, and the collector of the transistor $T14_C$ is connected directly to the output line 16. The base of the transistor $T13_C$ is connected to the rail 18 via a resistor R'', and the base of the transistor $T14_C$ is connected both to the rail 18 via a resistor R''', and to the rail 10 via a third constant current source indicated generally at 60, a current I'' being shown as flowing into the third constant current source 60. A further modification to the logic circuit of FIG. 5 is that, because of the change in the relative order of the level of the hierarchical arrangement receiving the second differential input B and B, a diode D3 is required to be provided between the rail 18 and the adjacent ends of the resistor R'. The arrangement is such that the same current I/4 flows in the circuits of the coupled emitters of both associated pairs of switching transistors $T11_C$ and $T12_C$, and $T13_C$ and $T14_C$, of the lowest of the three levels of the hierarchical arrangement. The logic circuit of FIG. 6 operates in a similar manner to the logic circuit of FIG. 4 having a hierarchical arrangement of a non-symmetrical form, and to the logic current of FIG. 5 having the quasi-symmetrical form of hierarchical arrangement.

Again in accordance with the present invention a switch 24, controlled by a clock 26, is provided between the constant current source 12 and the emitters of the pair of transistors $T11_A$, $T12_A$ of the highest level of the quasi-symmetrical hierarchical arrangement. A switch 52 controlled by the clock 26 is provided between the second constant current source 50 and the transistor $T13_B$. A switch 62 also controlled by the clock 26 is provided between the third constant current source 60 and the transistor $T14_C$, the operation of the switch being controlled in the same way as the switch 24 associated with the first constant current source 12.

The inherently fast switching speeds associated with logic circuits in accordance with the present invention, further, can be realised to advantage in a non-combinatorial system, comprising another aspect in accordance with the present invention, having a plurality of such logic circuits connected in series, each such logic circuit having a hierarchical arrangement of a symmetrical form, or quasi-symmetrical form, and with switching means associated with each constant current source of the logic circuit, there being no latches, or other form of memory device, between the series-connected logic circuits. Such a non-combinatorial system is shown in FIG. 7 having three logic circuits 70, 71 and 72, each in accordance with the present invention. Each of the logic circuits 70, 71 and 72 is substantially as described above in relation to FIG. 2, and the logic circuits are substantially identical with each other. Constituent components, and lines and rails, of one logic circuit 70 of the system of FIG. 7, and identical with, or closely resembling, such components, and lines and rails of the logic circuit of FIG. 2, are designated in the same way in both Figures.

Each of the logic circuits 70, 71 and 72 of FIG. 7 is driven ON and OFF by the provision of a switch 24, the operation of which switch is controlled by a clock 26 substantially as described above in relation to FIG. 2, a common clock being provided for the three logic circuits.

The differential output of each of the two logic circuits 70 and 71 comprises a differential input for the third logic circuit 72. Hence, the logic circuits 70 and 72, and 71 and 72, are connected in series, in a non-combinatorial way.

Further, because the differential output of each of the two logic circuits 70 and 71 comprises a differential input for the third logic circuit 72 it is necessary to provide interfacing means between each such series connected pair of logic circuits substantially as described above in relation to FIG. 2. However, each of the two logic circuits 70 and 71 comprise a hierarchical arrangement with only two constituent levels, so, as shown in relation to the gate 70 the interfacing means comprises only two emitter followers T9 and T10 and auxiliary constant current sources 20 and 22, with switches, respectively 30 and 32, in substantially the same manner as described with reference to FIG. 2, but without the diodes D1 and D2. For the sake of clarity, the identical interfacing means to that of the logic circuit 70, and provided in the logic circuit 71, is shown as comprising two emitter followers T29 and T30, and two auxiliary constant current sources 20' and 22' and switches 30' and 32'.

The three logic circuits 70, 71 and 72 share common rails 10 and 18. The constituent components, and lines and rails, of each logic circuit, other than the bipolar switching transistors, are designated in the same way.

For convenience, the bipolar switching transistors of the logic circuit 71 corresponding to the transistors $T1_A$, $T2_A$, $T1_B$, $T2_B$, $T3_B$ and $T4_B$ of the logic circuit 70, are designated, respectively, $T31_A$, $T32_A$, $T31_B$, $T32_B$, $T33_B$ and $T34_B$.

The two differential inputs of the logic circuit 70 are designated A1, A1, and B1, B1, and the corresponding differential output, produced in response in response to these differential inputs, is designated A3, A3, provided, respectively, on the lines 14 and 16 thereof.

The two differential inputs of the logic circuit 71 are designated A2, A2, and B2, B2, and the corresponding differential output, produced in response to these differential inputs, is designated B3, B3, provided, respectively, on the lines 14 and 16 thereof.

As indicated above, the two differential inputs of the logic circuit 72 comprise the two differential outputs of the logic circuits 70 and 71. The corresponding differential output, produced in response to these differential inputs is designated Y, Y, provided, respectively, on the lines 14 and 16 of the logic circuit 72.

Thus, each of the logic circuits 70, 71 and 72 operates in a manner described above.

However, in relation to the non-combinatorial system of series-connected logic circuits described above, and considered as a whole, when the logic circuits are driven ON, and the differential inputs are supplied thereto, the system operates in a similar manner to each constituent logic circuit as described above. In particular, for each logic circuit, each constituent gating combination varies from its equilibrium condition when the logic circuit is driven ON, and it is inherent that the appropriate change in the collector potentials of the associated pair of switching transistors inherently starts to take place in the appropriate sense. Hence, within the non-combinatorial system each constituent logic circuit varies from its equilibrium condition, in this manner, as soon as the differential inputs thereto begin to become established, and the logic circuits are driven ON. In particular, the differential inputs A3, A3, and B3, B3 for the logic circuit 72 inherently, inititially, begin to become established in the appropriate sense, so that the logic circuit 72 can begin operating upon these differential inputs before the associated input logic levels of these differential inputs have become fully established. Hence, in the non-combinatorial system high equivalent gate speeds are obtained, and the overall system delay is less than the sum of the delays of the series-connected logic circuits.

Because any form of logic circuit in accordance with the present invention inherently is in an equilibrium condition when not being driven ON, irrespective of whether differential inputs are being supplied to the logic circuit or not, and irrespective of the input logic levels of the differential inputs, if provided, it may be required to provide within the logic circuit a latch complementary in construction to the remainder of the logic circuit. One such form of latch is shown in FIG. 8.

The illustrated latch, to be included within a logic circuit, having a hierarchical arrangement of two constituent levels, and to be driven ON and OFF, is provided between the rail 10 maintained at zero potential, and the rail 18 maintained at the potential Vcc. The differential input IN to the latch, from a preceding part of the logic circuit in accordance with the present invention, is supplied to the bases of two NPN bipolar input transistors T51 and T52. The input transistors T51 and T52 are in separate arms of two parallel arms of the latch provided between the rails 10 and 18. In the first arm of the latch the collector of the input transistor T51 is connected to the rail 18 via a resistor R1. The emitter of the input transistor T51 is connected in series with a diode D4 and the collector of an NPN bipolar switching transistor T53. In the other arm of the latch the collector of the input transistor T52 also is connected to the rail 18 via a resistor R1. The emitter of the input transistor T52 is connected in series with a diode D5 and the collector of an NPN bipolar switching transistor T54. The bases and the collectors of the transistors T53 and T54 are cross-coupled. The emitters of the cross-coupled transistors T53 and T54 are connected together, and are connected to the rail 10 via an unswitched constant current source 80, and are also connected to the rail 10 via a, parallel, switched constant current source 82. The current flowing into the unswitched constant current source 80 from the adjacent coupled emitters of the transistors T53 and T54 is indicated as being I1, for example, 10 micro-amperes, insufficient to drive the latch. The current flowing into the switched constant current source 82 from the adjacent coupled emitters of the transistors T53 and T54 is indicated as being 100 I1, or 1 milli-ampere, or a current one hundred times greater than the current I1 associated with the constant current source 80, and is sufficient to drive the latch. The differential output OUT from the latch is provided on lines 84 and 86, respectively, connected to a point between the resistor R1 and the input transistor T51 in one arm of the latch, and connected to a point between the resistor R1 and the input transistor T52 in the other arm of the latch. A switch, indicated generally at 88, and usually comprising a bipolar switching transistor, is provided between the constant current source 82 and the coupled emitters of the transistors T53 and T54, the operation of the switch, conveniently being controlled by the clock 26 controlling the other switches provided within the logic circuit in accordance with the present invention. No switch is provided between the constant current source 80 and the adjacent coupled emitters of the transistors T53 and T54.

In operation, the latch is set when the switch 88 is closed under the control of the clock 26, and a current greater than 100 I1 is flowing in the coupled emitter circuits of the transistors T53 and T54 to drive the latch. If the input transistor T51 is switch ON, by the associated differential input part to the latch being at the more positive of the two possible logic levels associated with the differential input to the latch, and the input transistor T52 is switched OFF, by the associated differential input part to the latch being at the more negative of the two possible logic levels, the potential in the collector circuit of the transistor T53, and in the base circuit of the transistor T54, is low, and the potential in the collector circuit of the transistor 54, and in the base circuit of the transistor T53, is high, and the latch sets. The output line 84 is at the more negative of the two possible output logic levels associated with the differential output from the latch, and the output line 86 is at the more positive of these two possible output logic levels. The latch also sets, but in the opposite sense, when the differential input part to the input transistor T51 is at the more negative of the two possible input logic levels, and the differential input part to the input transistor T52 is at the more positive of these logic levels. In this case the output line 84 is at the more positive of the two possible output logic levels, and the output line 86 is at the more negative of these logic levels. With the latch set in one of the two possible ways indicated above, the switch 88 may be opened, under the control of the clock 26, and only the current I1, insufficient to drive the latch, flows in the coupled emitter circuits of the transistors T53 and T54. In this condition, the latch remains set, and the output logic levels are maintained on the lines 84 and 86, irrespective of the potentials in the base circuits of the input transistors T51 and T52. The latch can be considered to be in a quiescent state, and consumes very little energy. The switch 88 may be open for a time much longer than it is closed, say, ten times longer, to reduce the energy consumption of the latch.

When the switch 88 is again closed under the control of the clock 26, the latch is capable of being re-set, if required, in response to a change in the differential input signals to the latch. If the differential input parts are then at the same input logic levels as when the latch entered its previous quiescent state, the output lines 84 and 86 remain at the same output logic levels. However, if the differential input parts are then at the other of the two possible input logic levels than when the latch entered its previous quiescent state, the output lines 84 and 86 change to the other of the two possible output logic levels, and remain in this condition when the switch 88 opens, and the latch re-enters its quiescent state.

Many possible modifications in the latch circuit are possible. Further, the required memory stage for a logic circuit in accordance with the present invention may be provided by forming a D type bistable element including two latch circuits as described above. Alternatively, the latch circuit may comprise a register stage.

Such a memory state may be provided at the end of a plurality of logic circuits, each in accordance with the present invention, and connected in series with each other; or the memory stage may be provided intermediate between a series combination of a plurality of logic circuits each in accordance with the present invention.

The construction of any form of logic circuit in accordance with the present invention is readily adopted to be obtained by employing a cell of an uncommitted gate array, within a monolithic semiconductor body, such a semiconductor device comprising still another aspect in accordance with the present invention, which cell is at least partially in the form of a symmetrical hierarchical arrangement, such as in the logic circuit of FIG. 2, or a quasi-symmetrical hierarchical arrangement such as in the logic circuits of FIGS. 5 and 6, and in relation to the cell there is the ability to provide at least some of the required electrical interconnections of any desired form of logic circuit on the surface of the semiconductor body, between the constituent components, and the lines and the rails, in a known discretionary manner. Thus, for example, such a cell may include a two level hierarchical arrangement, and be capable of providing, by providing the appropriate interconnections, either the symmetrical Exclusive OR gate of FIG. 2, or the symmetrical OR/AND gate of FIG. 5 or 6, and described in detail above.

In any circuit in accordance with the present invention any common mode voltage may be eliminated, or reduced, if required, in any convenient way.

What I claim is:

1. A bipolar transistor logic circuit having differential inputs and two output lines constituting a differential pair, said logic circuit comprising:
    at least three gating combinations, each gating combination comprising an associated pair of switching transistors having their emitters connected together;
    said gating combinations arranged in a symmetrical hierarchical arrangement with a plurality of constituent levels, the highest level having only one gating combination;
    a constant current source;
    for the gating combination of the highest level of the hierarchical arrangement, the emitters being connected to said constant current source;
    for each gating combination of each other constituent level of the hierarchical arrangement, the emitters being connected to a collector of an associated pair of switching transistors of the adjacent higher level of the hierarchical arrangement;
    the two collectors of the associated pair of switching transistors of the highest level of the hierarchical arrangement, and at least one collector of each associated pair of switching transistors of each level of the hierarchical arrangement, except the lowest level, being connected individually to the emitters of an associated pair of switching transistors of the adjacent lower level of the hierarchical arrangement;
    the differential inputs to the logic circuit being connected to transistor bases, with different differential inputs being supplied to different constituent levels of the hierarchical arrangement;
    said circuit being arranged, such that, in response to the differential inputs a corresponding differential output is provided on the output lines, the two output lines being at least coupled, selectively, to the collectors of associated pairs of switching transistors of at least the lowest level of the hierarchical arrangement, all the collectors of the associated pairs of switching transistors of the lowest level of the hierarchical arrangement being coupled selectively to one or the other of the two output lines; and
    switching means for controlling said constant current source to enable the logic circuit to be driven ON and OFF.

2. A logic circuit in accordance with claim 1, wherein said switching means is controlled by a clock in synchronism with possible changes in input logic levels.

3. A logic circuit as claimed in claim 1 arranged such that for each differential input, and the differential output, considered individually, the potential difference between the associated two possible logic levels is 0.1 volt.

4. A logic circuit as claimed in claim 1 arranged such that the two possible output logic levels are the same as the two possible input logic levels associated with each differential input, the output lines on which the differential output from the logic circuit is provided are coupled to the collectors of associated pairs of switching transistors of at least the lowest level of the hierarchical arrangement via interfacing means, and the required interfacing means comprises at least an emitter follower between a collector, or the common connection of a plurality of collectors, of associated pairs of switching transistors of at least the lowest level of hierarchical arrangement, and the associated output line, and an auxiliary constant current source is connected to a point between the emitter follower and the output line, different such combinations, each having at least an emitter follower and an auxiliary constant current source, being associated individually with the two output lines.

5. A bipolar transistor logic circuit having differential inputs and two output lines constituting a differential pair, said logic circuit comprising:
    at least three gating combinations, each gating combination comprising an associated pair of switching transistors having their emitters connected together;
    said gating combinations arranged in a quasisymmetrical hierarchical arrangement with a plurality of constituent levels, the highest level having only one gating combination;
    first and second constant current sources;
    for the gating combination of the highest level of the hierarchical arrangement, the emitters being connected to said first constant current source;
    for each gating combination of each other constituent level of the hierarchical arrangement, the emitters being connected to a collector of an associated pair of switching transistors of the adjacent level of the hierarchical arrangement;
    the two collectors of the associated pair of switching transistors of the highest level of the hierarchical arrangement, and at least one collector of each associated pair of switching transistors of each level of the hierarchical arrangement, except the lowest level, being connected individually to the emitters of an associated pair of switching transistors of the adjacent lower level of the hierarchical arrangement;

only one of the pairs of switching transistors in each constituent level of the hierarchical arrangement serving as input switching transistors, the differential inputs to the logic circuit being connected to the input switching transistors, with different differential inputs being supplied to different constituent levels of the hierarchical arrangement;

another one of the pairs of switching transistors in each constituent level of the hierarchical arrangement, other than the highest level, not being arranged to receive a differential input to said logic circuit but rather serving to provide the hierarchical arrangement with a quasisymmetrical form;

for each of said another one of the pairs of switching transistors, considered individually, the base of one of the pairs is connected to said second constant current source, and the emitters are connected together, and, for the next to highest level of the hierarchical arrangement, the emitters are connected to a collector of the pair of input switching transistors of the highest level, and, for each other level, the emitters are connected to a collector of said another one of the pairs of switching transistors of the adjacent higher level of the hierarchical arrangement;

said circuit being arranged, such that, in response to the differential inputs a corresponding differential output is provided on the output lines, the two output lines being at least coupled, selectively, to the collectors of associated pairs of switching transistors of at least the lowest level of the hierarchical arrangement, all the collectors of the associated pairs of switching transistors of the lowest level of the hierarchical arrangement being coupled selectively to one or the other of the two output lines; and switching means for controlling said constant current sources to enable the logic circuit to be driven ON and OFF.

6. A bipolar transistor logic circuit having differential inputs and two output lines constituting a differential pair, said logic circuit comprising:

at least three gating combinations, each gating combination comprising an associated pair of switching transistors having their emitters connected together;

said gating combinations arranged in a symmetrical hierarchical arrangement with a plurality of constituent levels, the highest level having only one gating combination;

a constant current source;

for the gating combination of the highest level of the hierarchical arrangement, the emitters being connected to said constant current source;

for each gating combination of each other constituent level of the hierarchical arrangement, the emitters being connected to a collector of an associated pair of switching transistors of the adjacent higher level of the hierarchical arrangement;

the two collectors of the associated pair of switching transistors of the highest level of the hierarchical arrangement, and at least one collector of each associated pair of switching transistors of each level of the hierarchical arrangement, except the lowest level, being connected individually to the emitters of an associated pair of switching transistors of the adjacent lower level of the hierarchical arrangement;

the differential inputs to the logic circuit being connected to transistor bases, with different differential inputs being supplied to different constituent levels of the hierarchical arrangement;

said circuit being arranged, such that, in response to the differential inputs a corresponding differential output is provided on the output lines, the two output lines being at least coupled, selectively, to the collectors of associated pairs of switching transistors of at least the lowest level of the hierarchical arrangement, all the collectors of the associated pairs of switching transistors of the lowest level of the hierarchical arrangement being coupled selectively to one or the other of the two output lines;

switching means for controlling said constant current source to enable the hierarchical arrangement of gating combinations to be driven ON and OFF;

a latch having two parallel arms, each latch arm including a bipolar input transistor and a bipolar switching transistor;

the bases of the latch input transistors at least coupled, selectively, to the collectors of associated pairs of switching transistors of at least the lowest level of the hierarchical arrangement;

the emitter of each latch input transistor being coupled to the bipolar switching transistor of the same arm;

the collectors and bases of the two bipolar switching transistors of the two arms of the latch being cross-coupled;

a latch switching means;

two constant current sources connected in parallel;

the emitters of the two cross-coupled latch switching transistors being connected together and connected to said parallel constant current sources;

the current of one of said paralleled constant current sources being insufficient to drive the latch, but sufficient to maintain the latch set;

the current of the other of said parallel constant current sources being sufficient to drive the latch, to render the latch capable of being set in response to differential input signals to the latch; and said one of said parallel constant current sources being connected directly to the emitters of the cross-coupled transistors, and said other of said parallel constant current sources being coupled to the emitters of the cross-coupled transistors via said latch switching means.

7. A bipolar transistor logic circuit comprising:

a hierarchical arrangement of at least three gating combinations, each gating combination comprising an associated pair of switching transistors;

a constant current source supplying said hierarchical arrangement;

switching means for controlling said constant current source to enable said hierarchical arrangement to be driven ON and OFF;

a latch having two parallel arms, each latch arm including a bipolar input transistor and a bipolar switching transistor;

the bases of the latch input transistors at least coupled, selectively, to the collectors of associated pairs of switching transistors of at least the lowest level of the hierarchical arrangement;

the emitter of each latch input transistor being coupled to the bipolar switching transistor of the same arm;

the collectors and bases of the two bipolar switching transistors of the two arms of the latch being cross-coupled;

a latch switching means;

two constant current sources connected in parallel;

the emitters of the two cross-coupled latch switching transistors being connected together and connected to said parallel constant current sources;

the current of one of said parallel constant current sources being insufficient to drive the latch, but sufficient to maintain the latch set;

the current of the other of said parallel constant current sources being sufficient to drive the latch, to render the latch capable of being set in response to differential input signals to the latch; and said one of said parallel constant current sources being connected directly to the emitters of the cross-coupled transistors, and said other of said parallel constant current sources being coupled to the emitters of the cross-coupled transistors via said latch switching means; and common timing means controlling said hierarchical arrangement switching means and controlling said latch switching means.

8. A combination comprising:

a plurality of series-connected bipolar transistor logic circuits, each of said logic circuits comprising:

differential inputs and two output lines constituting a differential pair, at least three gating combinations, each gating combination comprising an associated pair of switching transistors having their emitters connected together, said gating combinations arranged in a symmetrical hierarchical arrangement with a plurality of constituent levels, the highest level having only one gating combination, a constant current source, for the gating combination of the highest level of the hierarchical arrangement, the emitters being connected to said constant current source, for each gating combination of each other constituent level of the hierarchical arrangement, the emitters being connected to a collector of an associated pair of switching transistors of the adjacent higher level of the hierarchical arrangement, the two collectors of the associated pair of switching transistors of the highest level of the hierarchical arrangement, and at least one collector of each associated pair of switching transistors of each level of the hierarchical arrangement, except the lowest level, being connected individually to the emitters of an associated pair of switching transistors of the adjacent lower level of the hierarchical arrangement, the differential inputs to the logic circuit being connected to transistor bases, with different differential inputs being supplied to different constituent levels of the hierarchical arrangement, said circuit being arranged, such that, in response to the differential inputs a corresponding differential output is provided on the output lines, the two output lines being at least coupled, selectively, to the collectors of associated pairs of switching transistors of at least the lowest level of the hierarchical arrangement, all the collectors of the associated pairs of switching transistors of the lowest level of the hierarchical arrangement being coupled selectively to one or other of the two output lines, and switching means for controlling said constant current source to enable the logic circuit to be driven ON and OFF; and a common clock controlling the switching means of all of said logic circuits.

* * * * *